(12) United States Patent
Su

(10) Patent No.: US 10,867,804 B2
(45) Date of Patent: Dec. 15, 2020

(54) PATTERNING METHOD FOR SEMICONDUCTOR DEVICE AND STRUCTURES RESULTING THEREFROM

(71) Applicant: Taiwan Semiconductor Manufacturing Company, Ltd., Hsinchu (TW)

(72) Inventor: Yi-Nien Su, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/131,787

(22) Filed: Sep. 14, 2018

(65) Prior Publication Data

US 2020/0006082 A1    Jan. 2, 2020

Related U.S. Application Data

(60) Provisional application No. 62/691,835, filed on Jun. 29, 2018.

(51) Int. Cl.
*H01L 21/311* (2006.01)
*H01L 21/02* (2006.01)
*H01L 21/033* (2006.01)

(52) U.S. Cl.
CPC .... *H01L 21/31144* (2013.01); *H01L 21/0217* (2013.01); *H01L 21/02123* (2013.01); *H01L 21/02164* (2013.01); *H01L 21/02178* (2013.01); *H01L 21/02183* (2013.01); *H01L 21/02186* (2013.01); *H01L 21/0337* (2013.01); *H01L 21/31122* (2013.01)

(58) Field of Classification Search
None
See application file for complete search history.

(56) References Cited

U.S. PATENT DOCUMENTS

| 4,544,444 | A | * | 10/1985 | Chang | C04B 41/009 |
| | | | | | 204/192.37 |
| 9,812,325 | B2 | | 11/2017 | Mohanty et al. | |
| 9,824,893 | B1 | | 11/2017 | Smith et al. | |
| 10,177,005 | B2 | | 1/2019 | Chang et al. | |
| 10,373,828 | B2 | | 8/2019 | Ranjan et al. | |
| 2018/0157175 | A1 | * | 6/2018 | Liu | G03F 7/0384 |
| 2018/0240667 | A1 | * | 8/2018 | Yu | H01L 21/31116 |
| 2019/0237341 | A1 | * | 8/2019 | Yu | H01L 21/31138 |

FOREIGN PATENT DOCUMENTS

| TW | 201715645 A | 5/2017 |
| TW | 201729292 A | 8/2017 |
| TW | 201812834 A | 4/2018 |
| TW | 201812848 A | 4/2018 |

* cited by examiner

*Primary Examiner* — Alexander G Ghyka
(74) *Attorney, Agent, or Firm* — Slater Matsil, LLP

(57) ABSTRACT

An embodiment method includes patterning a tin oxide layer to define a plurality of mandrels over a target layer; depositing a spacer layer over and along sidewalls of the plurality of mandrels; and patterning the spacer layer to provide a plurality of spacers on the sidewalls of the plurality of mandrels. The method further includes after patterning the spacer layer, removing the plurality of mandrels. The method further includes after removing the plurality of mandrels, patterning the target layer using the plurality of spacers.

20 Claims, 8 Drawing Sheets

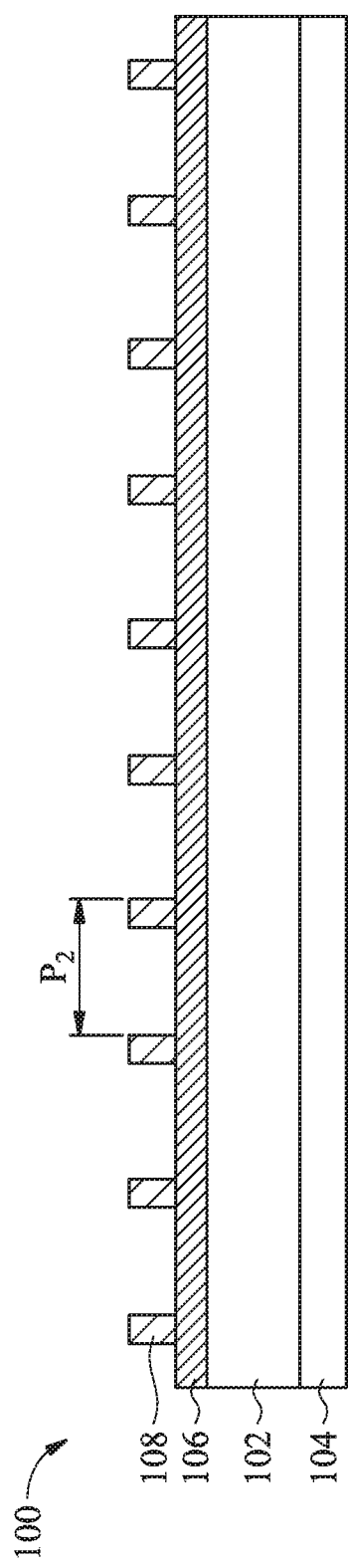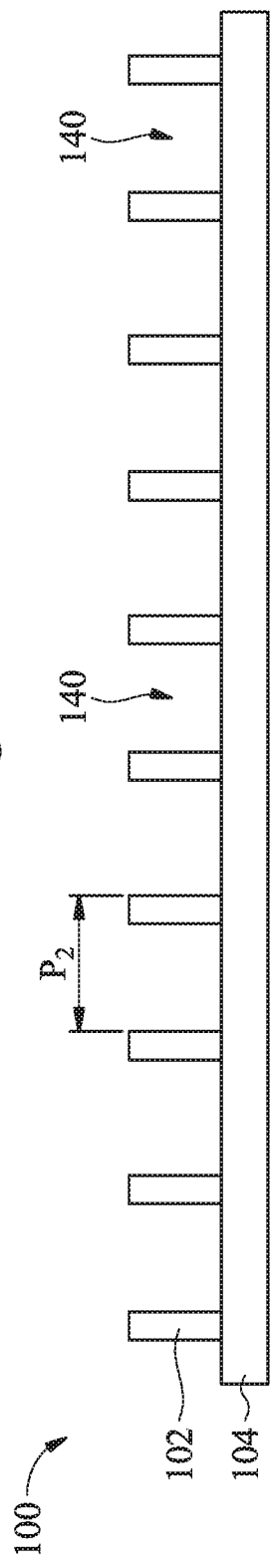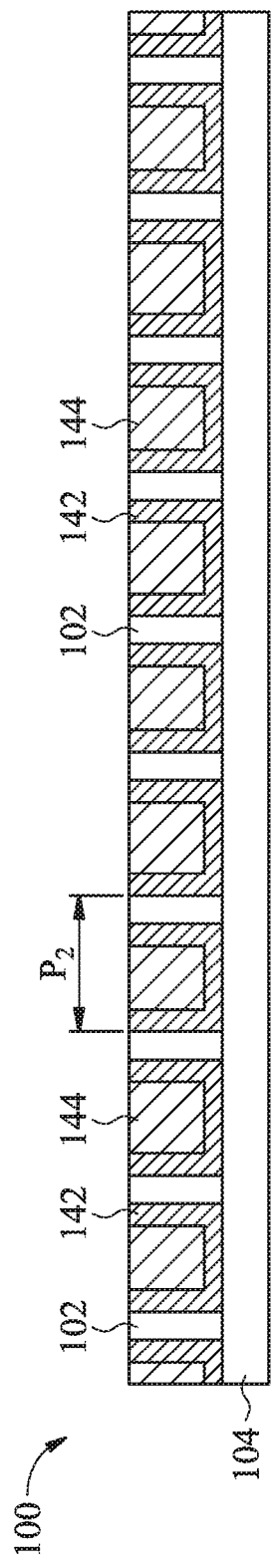

US 10,867,804 B2

PATTERNING METHOD FOR SEMICONDUCTOR DEVICE AND STRUCTURES RESULTING THEREFROM

PRIORITY

This application claims the benefit of U.S. Provisional Application No. 62/691,835, filed on Jun. 29, 2018, which application is hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 10 illustrate cross-sectional views of various intermediary stages of manufacturing a semiconductor device according to various embodiments.

DETAILED DESCRIPTION

Figure 1:
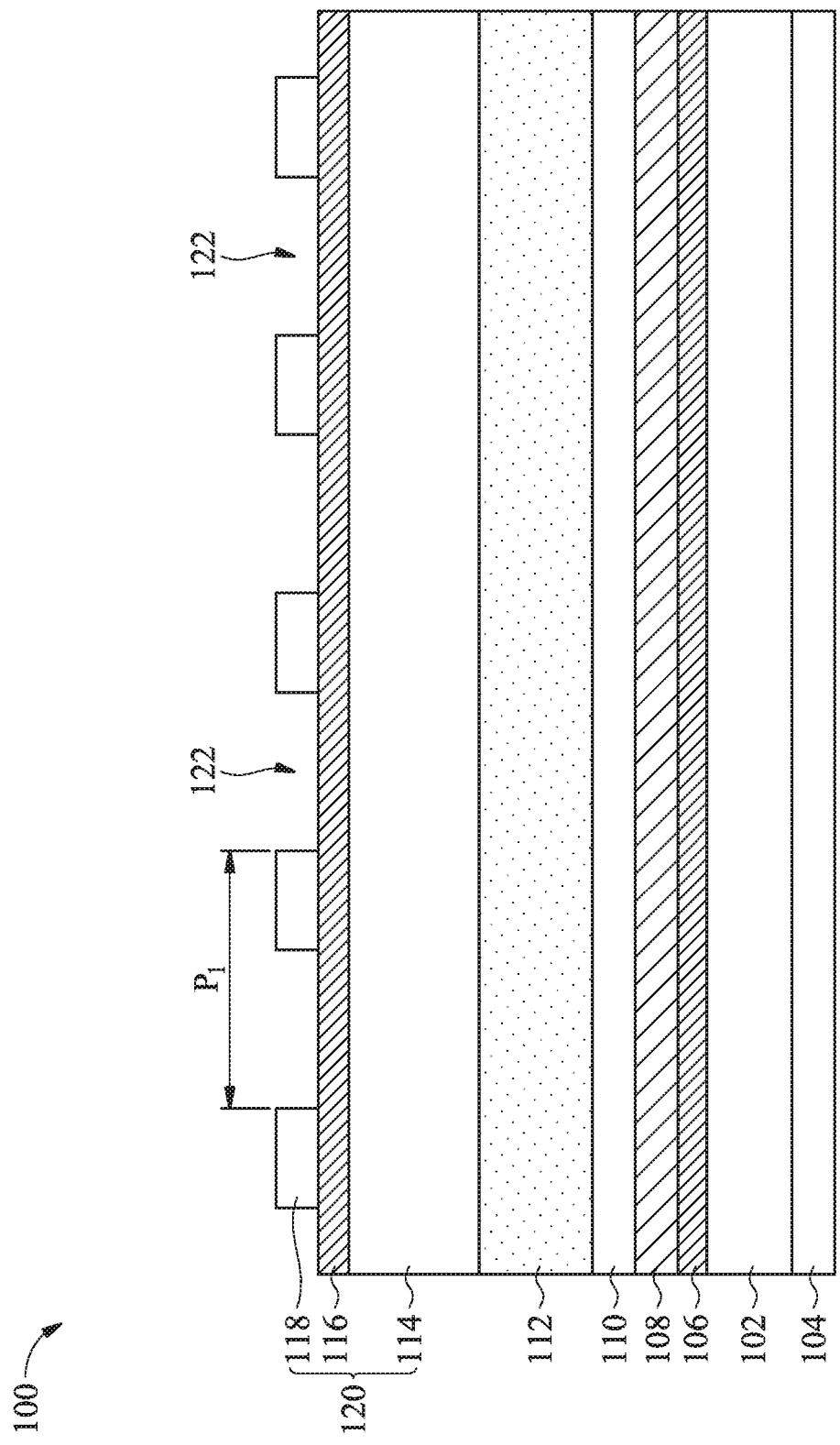

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in respect to a specifically patterning process, namely a self-aligned double patterning (SADP) process where mandrels are patterned, spacers are formed along sidewalls of the mandrels, and the mandrels are removed leaving the spacers to define a pattern at half a pitch of the mandrels. However, various embodiments may be directed at other patterning processes, such as, self-aligned quadruple patterning (SAQP), and the like.

A semiconductor device and method are provided in accordance with some embodiments. In particular, a self-aligned double patterning process is performed to pattern features (e.g., semiconductor fins, gate structures, conductive lines, or the like) in a semiconductor device. The patterned features have a pitch that is at least one half of a minimum pitch achievable using photolithographic processes. In various embodiments, tin oxide (SnO) is used as a material for mandrels, which are patterned using a photoresist as a patterning mask (e.g., at a minimum achievable pitch of the photoresist). In some embodiments, the photoresist may be removed using an oxygen plasma strip process. It has been observed that by using SnO mandrels, the mandrels are resistant to oxidation during the photo resist stripping process. By preventing undesirable oxidation of the mandrel material, manufacturing defects can be reduced.

Subsequently, spacers are formed on sidewalls of the mandrels, and the mandrels are selectively removed. The spacers are formed at one half of a pitch of the mandrels, and thus, features patterned using the spacers as a mask have a finer pitch than the mandrels. SnO mandrels have a further advantage of high etch selectivity to other materials (e.g., the spacer material, materials of the underlying layers, and the like), which further improves patterning reliability when patterning the spacers and/or selectively removing the mandrels. Thus, fine pitched semiconductor structures can be manufactured with improved yield.

FIGS. 1 through 10 illustrate cross-sectional views of intermediate stages in the formation of features in a target layer 102 on a semiconductor device 100, in accordance with some exemplary embodiments. The target layer 102 is a layer in which a plurality of patterns is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 102 is an intermetal dielectric (IMD) layer. In such embodiments, the target layer 102 comprises a low-k dielectric material having a dielectric constant (k value) lower than 3.8, lower than about 3.0, or lower than about 2.5, for example. In alternative embodiments, target layer 102 is an IMD layer comprising high-k dielectric material having a k value higher than 3.8. Openings may be patterned in the target layer 102 with the embodiment processes, and conductive lines and/or vias may be formed in the openings as described below.

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs).

In some embodiments, the target layer 102 is a conductive layer, such as, a metal layer or a polysilicon layer, which is blanket deposited. Embodiment patterning processes may be applied to the target layer 102 in order to pattern semiconductor gates and/or dummy gates of finFETS. By using embodiment processes to pattern a conductive target layer 102, spacing between adjacent gates may be reduced and gate density may be increased.

In FIG. 1, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on an active surface of semiconductor substrate 104. In other embodiments where the target layer 102 is a semiconductor substrate used to form finFETs, the semiconductor substrate 104 may be omitted.

Although FIG. 1 illustrates target layer 102 being in physical contact with semiconductor substrate 104, any number of intervening layers may be disposed between target layer 102 and semiconductor substrate 104. Such intervening layers may include an inter-layer dielectric (ILD) layer comprising a low-k dielectric and having contact plugs formed therein, other IMD layers having conductive lines and/or vias formed therein, one or more intermediary layers (e.g., etch stop layers, adhesion layers, etc.), combinations thereof, and the like. For example, an optional etch stop layer may be disposed directly under the target layer 102. The etch stop layer may act as a stop for an etching process subsequently performed on the target layer 102. The material and process used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), plasma vapor deposition (PVD), or the like.

The film stack further includes an optional dielectric layer 106 formed over the target layer 102. In some embodiments, the dielectric layer 106 may be formed from SiON, silicon carbide, materials doped with oxygen (O) and nitrogen (N), or the like. The dielectric layer 106 may be formed by Plasma Enhance Chemical Vapor Deposition (PECVD), High-Density Plasma (HDP) deposition, or the like. The dielectric layer 106 is an optional layer and may be excluded, for example, in embodiments where the hard mask layer 108 (described below) can be selectively etched relative the target layer 102.

The film stack further includes a hard mask layer 108 formed over the ARC 106 and the target layer 102. The hard mask layer 108 may be formed of a material that comprises a metal (e.g., titanium nitride, titanium, tantalum nitride, tantalum, a metal-doped carbide (e.g., tungsten carbide), or the like), a metalloid (e.g., silicon nitride, boron nitride, silicon carbide, or the like), an oxide (e.g., tetraethylorthosilicate (TEOS), or the like), silicon, or the like, and may be formed by PVD, Radio Frequency PVD (RFPVD), Atomic Layer Deposition (ALD), or the like. In subsequent processing steps, a pattern is formed on the hard mask layer 108 using an embodiment patterning process. The hard mask layer 108 is then used as an etching mask for etching the target layer 102, where the pattern of the hard mask layer 108 is transferred to the target layer 102.

The film stack further includes an optional dielectric layer 110 formed over the hard mask layer 108. The dielectric layer 110 may be formed from a silicon oxide, such as borophosphosilicate tetraethylorthosilicate (BPTEOS) or undoped tetraethylorthosilicate (TEOS) oxide, and may be formed by CVD, ALD, spin-on coating, or the like. In some embodiments, the dielectric layer 110 acts as an etch stop layer for patterning subsequently formed mandrels and/or spacers (e.g., mandrels 124, see FIG. 4, and spacers 128, see FIG. 6). In some embodiments, the dielectric layer 110 also acts as an anti-reflective coating. In some embodiments, the hard mask layer 108 and the dielectric layer 110 have different material compositions such that the hard mask layer 108 and the dielectric layer 110 can each be selectively etched. Although FIG. 1 illustrates the dielectric layer 110 as being disposed above the hard mask layer 108, in other embodiments, the dielectric layer 110 may be disposed under the hard mask layer 108.

The film stack further includes a mandrel layer 112 formed over the first dielectric hard mask layer 108. The first mandrel layer 112 comprises SnO, which has various advantages as described below. In some embodiments, an atomic ratio of tin to oxygen of the first mandrel layer 112 may be about 1:2 (e.g., $SnO_2$). In other embodiments, a different atomic ratio of tin to oxygen may be employed. The mandrel layer 112 may be deposited using any suitable process, such as, ALD, CVD, PVD, or the like. In some embodiments, $Sn(CH_3)_4$ and $O_2$ are used as precursors during the deposition, and the deposition may be conducted at a temperature of about 1° C. to about 200° C. and at a pressure of about 1 Torr to about 10 Torr. In some embodiments, a thickness of the first mandrel layer 112 may be in the range of 20 nm to about 100 nm, such as about 50 nm.

A tri-layer photoresist 120 is formed on the film stack over the mandrel layer 112. The tri-layer photoresist 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which include organic materials. In some embodiments, the bottom layer 114 may also be a bottom anti-reflective coating (BARC) layer. The middle layer 116 may comprise an inorganic material, which may be a nitride (such as silicon nitride), an oxynitride (such as silicon oxynitride), an oxide (such as silicon oxide), or the like. The middle layer 116 has a high etching selectivity relative to the upper layer 118 and the bottom layer 114. The various layers of the tri-layer photoresist 120 may be blanket deposited sequentially using, for example, spin-on processes. Although a tri-layer photoresist 120 is discussed herein, in other embodiments, the photoresist 120 may be a monolayer or a bilayer (e.g., comprising only the bottom layer 114 and the upper layer 118 without the middle layer 116) photoresist. The type of photoresist used (e.g., monolayer, bilayer, or tri-layer) may depend on the photolithography process used to pattern the mandrel layer 112. For example, in advanced extreme ultraviolet (EUV) lithography processes, a monolayer or bilayer photoresist 120 may be used.

In some embodiments, the upper layer 118 is patterned using a photolithographic process. Subsequently, the upper layer 118 is used as an etching mask for patterning of the middle layer 116 (see FIG. 2). The middle layer 116 is then used as an etching mask for patterning of the bottom layer 114, and the bottom layer 114 is then used to pattern the mandrel layer 112 (see FIGS. 3 and 4). It has been observed that by using a tri-layer photoresist (e.g., tri-layer photoresist 120) to etch a target layer (e.g., mandrel layer 112), improved definition in fine-pitched patterns can be achieved in the target layer (e.g., mandrel layer 112).

The upper layer 118 is patterned using any suitable photolithography process to form openings 122 therein. As an example of patterning openings 122 in the upper layer 118, a photomask may be disposed over the upper layer 118. The upper layer 118 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the top photoresist layer may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used. The pitch $P_1$ of the openings 122 may be the minimum pitch achievable using photolithographic processes alone. For example, in some embodiments, the pitch $P_1$ of the openings 122 is about 80 nm or less or even about 28 nm or less. Other pitches $P_1$ of the openings 122 are also contemplated.

Figure 2:
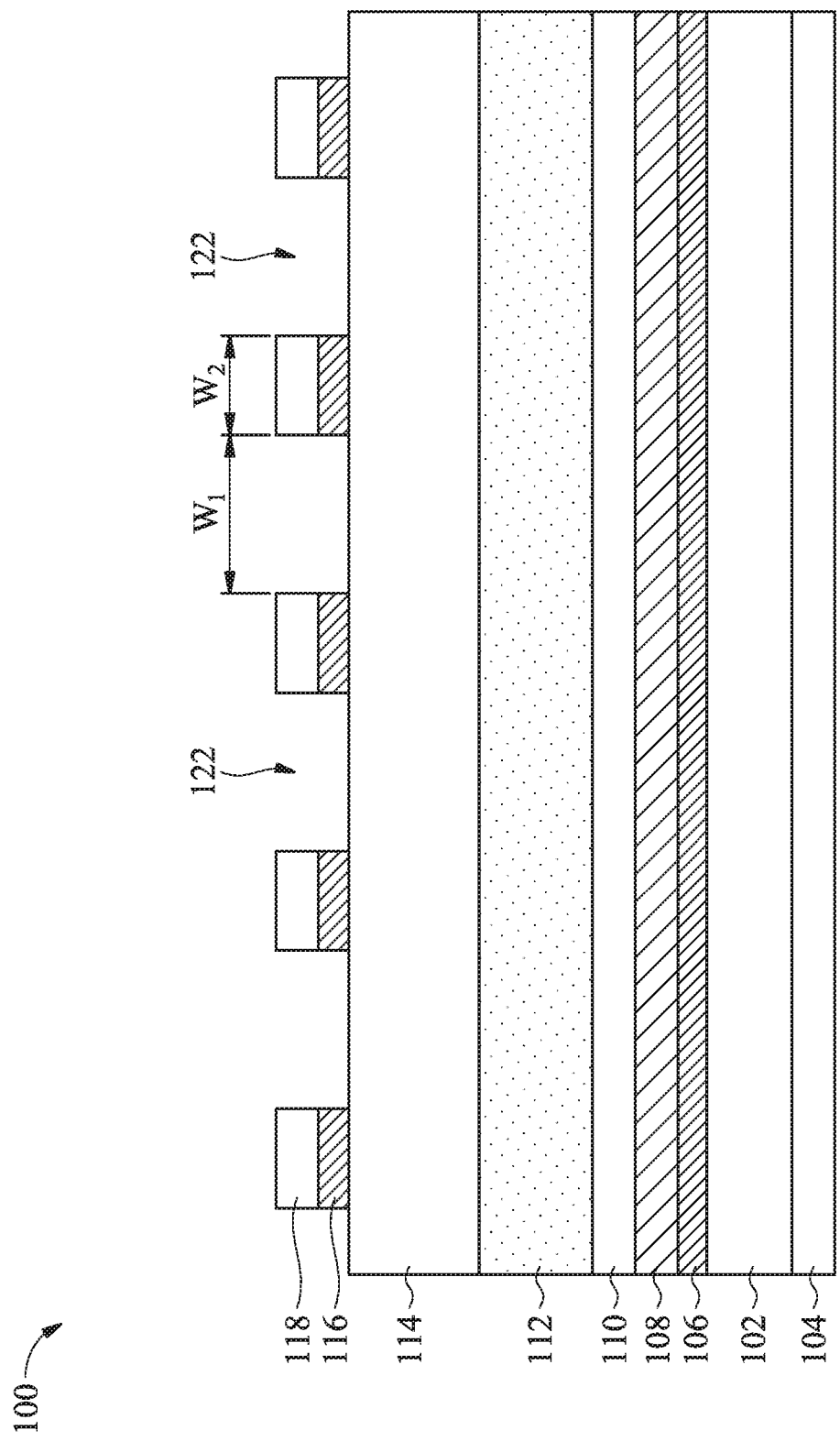

After the patterning of the upper layer 118, the pattern of the upper layer 118 is transferred to the middle layer 116 in an etching process. The etching process is anisotropic, so that the openings 122 in the upper layer 118 are extended through the middle layer 116 and have about the same sizes in the middle layer 116 as they do in the upper layer 118. The resulting structure is illustrated in FIG. 2.

Optionally, a trimming process may be performed to increase the size of the openings 122 in the middle layer 116. In an embodiment, the trimming process is an anisotropic plasma etch process with process gases including $O_2$, $CO_2$, $N_2/H_2$, $H_2$, the like, a combination thereof, or any other gases suitable for trimming the middle layer 116. The trimming may increase the width $W_1$ of the openings 122 and decrease the width $W_2$ of the portions of the middle layer 116 between the openings 122. For example, in some embodiments, after trimming, the width $W_2$ may be 20 nm or less. The trimming process may be performed in order to achieve a desired ratio of the width $W_1$ to the width $W_2$ so that subsequently defined lines are uniformly spaced. In other embodiments, the middle layer 116 is initially patterned to have a desired ratio of the width $W_1$ to the width $W_2$ and the trimming process may be omitted.

Figure 3:
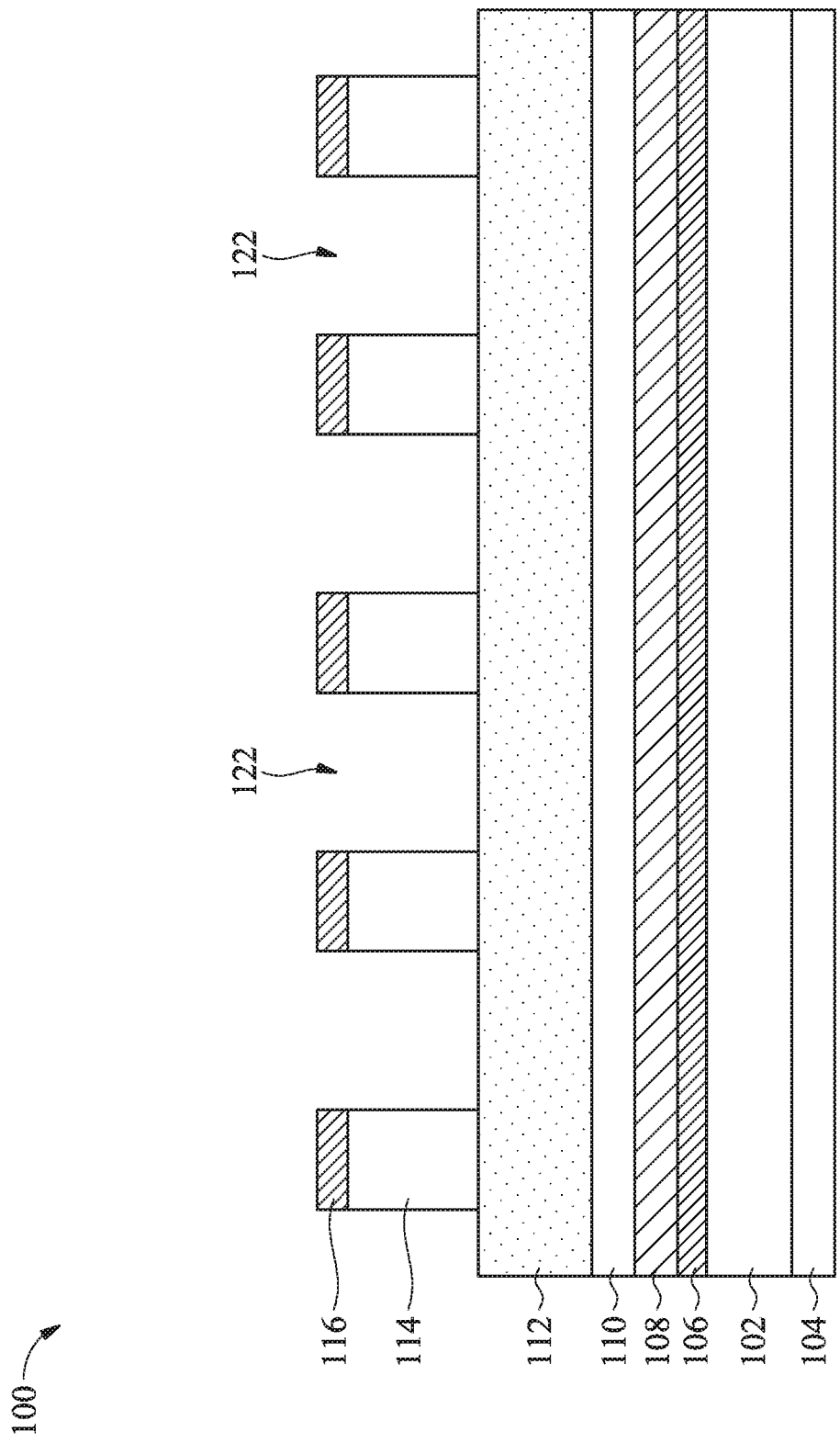

In FIG. 3, an etching process is performed to transfer the pattern of the middle layer 116 to the bottom layer 114, thereby extending the openings 122 through the bottom layer 114. The etching process of the bottom layer 114 is anisotropic, so that the openings 122 in the middle layer 116 are extended through the bottom layer 114 and have about the same sizes in the middle layer 116 as they do in the bottom layer 114. As part of etching the bottom layer 114, the upper layer 118 (see FIGS. 1 and 2) may be consumed.

Figure 4:
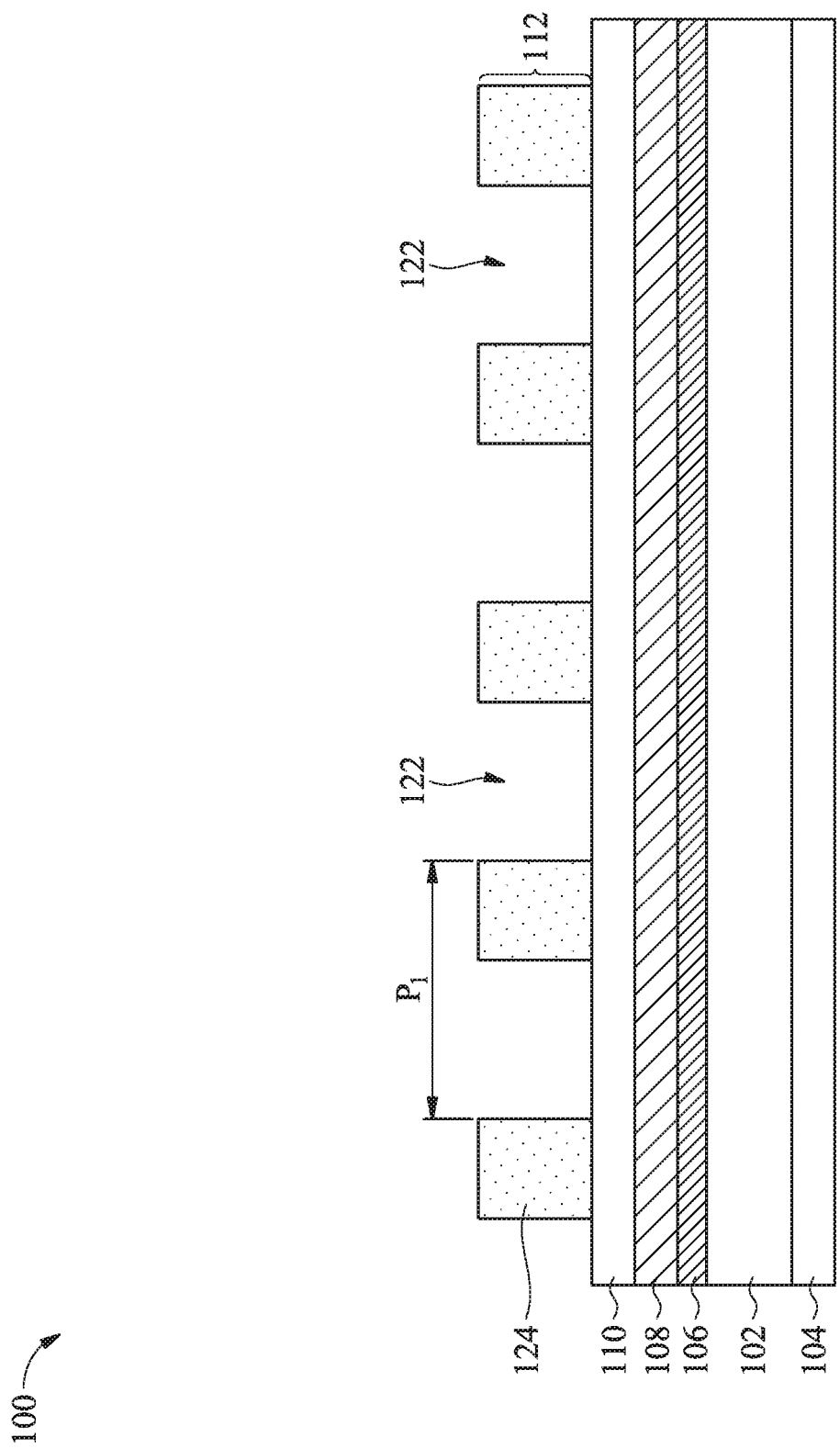

In FIG. 4, the pattern of the bottom layer 114 (see FIG. 3) is transferred to the mandrel layer 112 using an etching process. The etching process of the mandrel layer 112 is anisotropic, so that the openings 122 in the bottom layer 114 are extended through the mandrel layer 112 and have about the same sizes in the mandrel layer 112 as they do in the bottom layer 114. The etching may be a dry etch (e.g., a plasma etch) using a hydrogen-containing etchant with hydrogen as the reactive component of the etchant. For example, the etching chemistry may include hydrogen alone (e.g., $H_2$) or hydrogen in combination with other chemicals (e.g., HBr, $NH_3$, or the like) as an active etchant for etching the mandrel layer 112. In some embodiments, the etching chemistry uses hydrogen, either supplied alone or in combination with other chemical elements, as the reactant for etching the mandrel layer 112. The etching may further employ other processes gases (e.g., carrier gases, which may include Ar, $N_2$, combinations thereof, or the like) in addition to the active etchant(s). In an embodiment where the mandrel layer 112 is etched using $H_2$ plasma, the following reaction mechanisms (A) and (B) may apply.

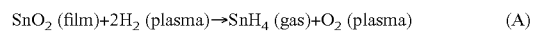

$$SnO_2 \text{ (film)} + 2H_2 \text{ (plasma)} \rightarrow SnH_4 \text{ (gas)} + O_2 \text{ (plasma)} \qquad (A)$$

$$SnO \text{ (film)} + O_2 \text{ (plasma)} \rightarrow SnO \text{ (film)} \qquad (B)$$

As discussed above and indicated by reaction mechanism (B), the tin oxide film is not easily oxidized and does not readily react with the oxygen plasma generated in reaction mechanism (A). The byproduct of the reaction may be gaseous $SnH_4$. In an embodiment, a flow rate of the hydrogen-containing etchant may be about 200 sccm, and a flow rate of carrier gases (e.g., Ar or $N_2$) may be about 200 sccm. The etching may be conducted at about room temperature 60° C. and at a pressure of about 10 mTorr to about 50 mTorr. Other process conditions (e.g., different flow rates, temperature, and/or pressure) may be used in other embodiments.

In other embodiments, a different reactant (e.g., chlorine ($Cl_2$)) may be used to etch the mandrel layer 112; the different reactant may be used in addition to or in lieu of the hydrogen-containing etchant discussed above. In an embodiment where the mandrel layer 112 is etched using $H_2$ plasma and $Cl_2$ plasma, Gaseous $SnCl_4$ may be a byproduct of the reaction.

A layer immediately underlying the mandrel layer 112 (e.g., the dielectric layer 110 or the hard mask layer 108) may be used as an etch stop layer when patterning the mandrel layer 112. The dielectric layer 110 or the hard mask layer 108 may be used as etch stop layers because the material of the mandrel layer 112 (e.g., SnO) can be patterned with a chemical etchant (e.g., a hydrogen-containing gas) that does not significantly etch a material of the underlying layer. For example, it has been observed that a hydrogen-containing gas etches SnO at a greater rate than materials used for the underlying layer (e.g., metals, metal alloys, silicon, silicon-comprising materials, or the like). In some embodiments, an etching rate of the mandrel layer 112 (e.g., SnO) may be in the range of about 10 nm/min to about 50 nm/min.

Thus, mandrels 124 are defined from remaining portions of the mandrel layer 112 (e.g., portions of mandrel layer 112 between openings 122). The mandrels 124 have a pitch $P_1$ (see also FIG. 1). In some embodiments, pitch $P_1$ is a minimum pitch achievable using photolithographic processes. Further, each mandrel 112 has a width $W_2$, which may be 20 nm or less in some embodiments. During etching the mandrel layer 112, the middle layer 116 is consumed, and bottom layer 114 may be at least partially consumed.

In embodiments when the bottom layer 114 is not completely consumed while etching the mandrel layer 112, an ashing process may be performed to remove remaining residue of the bottom layer 114. The ashing process may comprise an oxygen plasma strip, which exposes the mandrels 124 to oxygen plasma. In embodiments where the mandrels 124 are made of SnO, exposing the mandrels 124 to oxygen plasma does not significantly oxidize the mandrels 124 because SnO is resistant to oxidation. Thus, a configuration of the mandrels 124 (e.g., material composition and shape) can be maintained throughout the photoresist removal process.

In contrast, when the mandrels 124 are made of a different material than SnO, the ashing process may oxidize an exterior region of the mandrels 124. For example, in embodiments when the mandrels 124 are formed of amorphous silicon, amorphous silicon doped with carbon, amorphous silicon doped with boron, or the like, after the ashing process, an exterior region of the mandrels 124 may comprise silicon oxide, silicon carbon oxide, silicon boron oxide, or the like. In some embodiments, this exterior oxide region may extend up to 4 nm into the mandrels 124. At small pitches (e.g., when the mandrels 124 have a width of 20 nm or less), this 4 nm thick oxide region accounts for a unacceptably high percentage of the mandrels 124, which may result in poor critical dimension control in subsequent processing steps and manufacturing defects.

Figure 5:
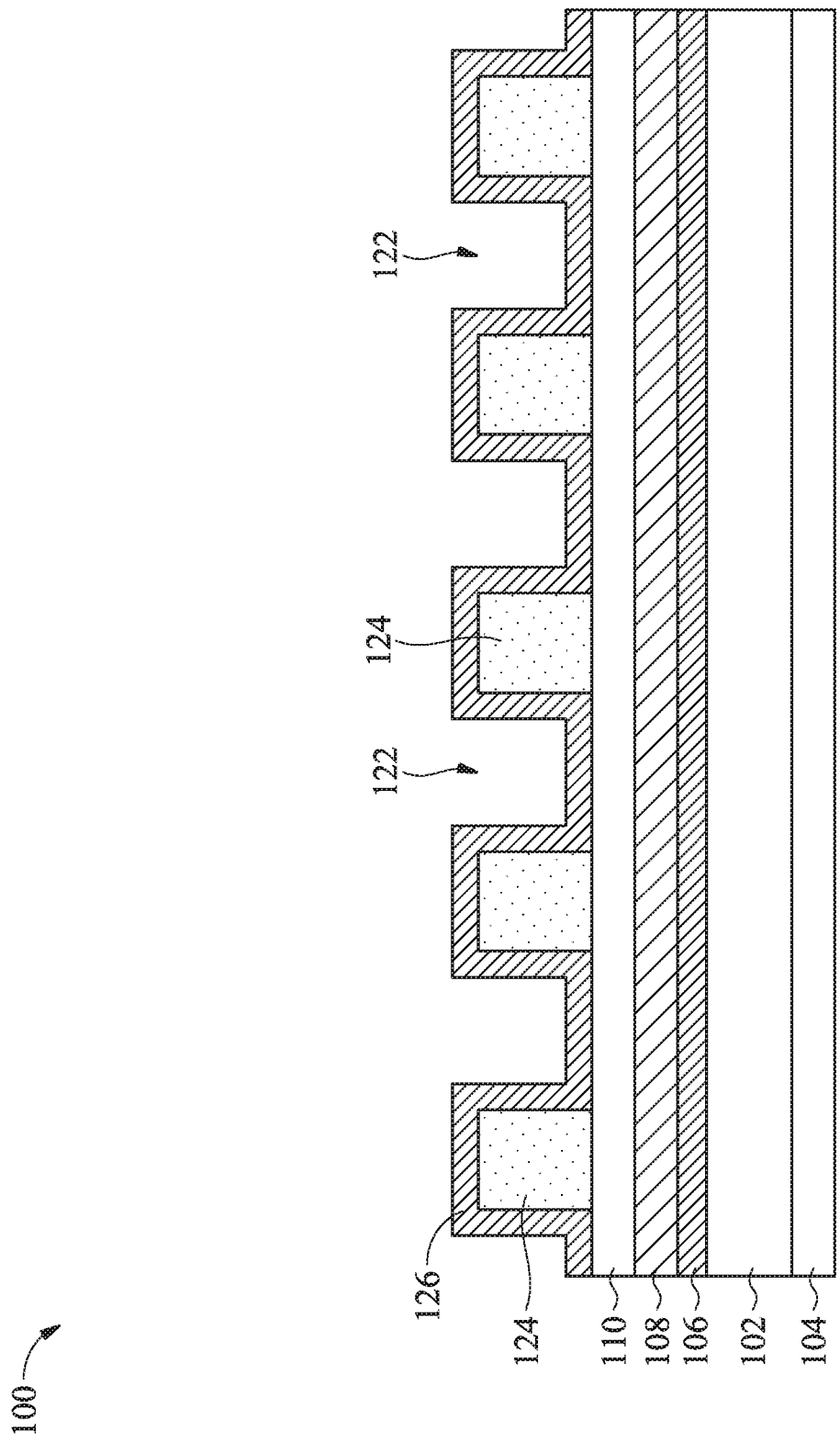

In FIG. 5, a spacer layer 126 is formed over and along sidewalls of the mandrels 124. The spacer layer 126 may further extend along top surfaces of dielectric layer 110 in the openings 122. The material of the spacer layer 126 is selected to have a high etching selectivity with the dielectric layer 110 (or the hard mask layer 108) and then mandrels 124. For example, the spacer layer 126 may be comprise AlO, AlN, AlON, TaN, TiN, TiO, Si, SiO, SiN, metals, metal alloys, and the like, and may be deposited using any suitable process such as ALD, CVD, or the like. In some embodiments, the deposition process of the spacer layer 126 is conformal so that a thickness of the spacer layer 126 on sidewalls of the mandrels 124 is substantially equal (e.g., within manufacturing tolerances) of a thickness of the spacer layer 126 on the top surface of mandrels 124 and bottom surfaces of the openings 122.

Figure 6:
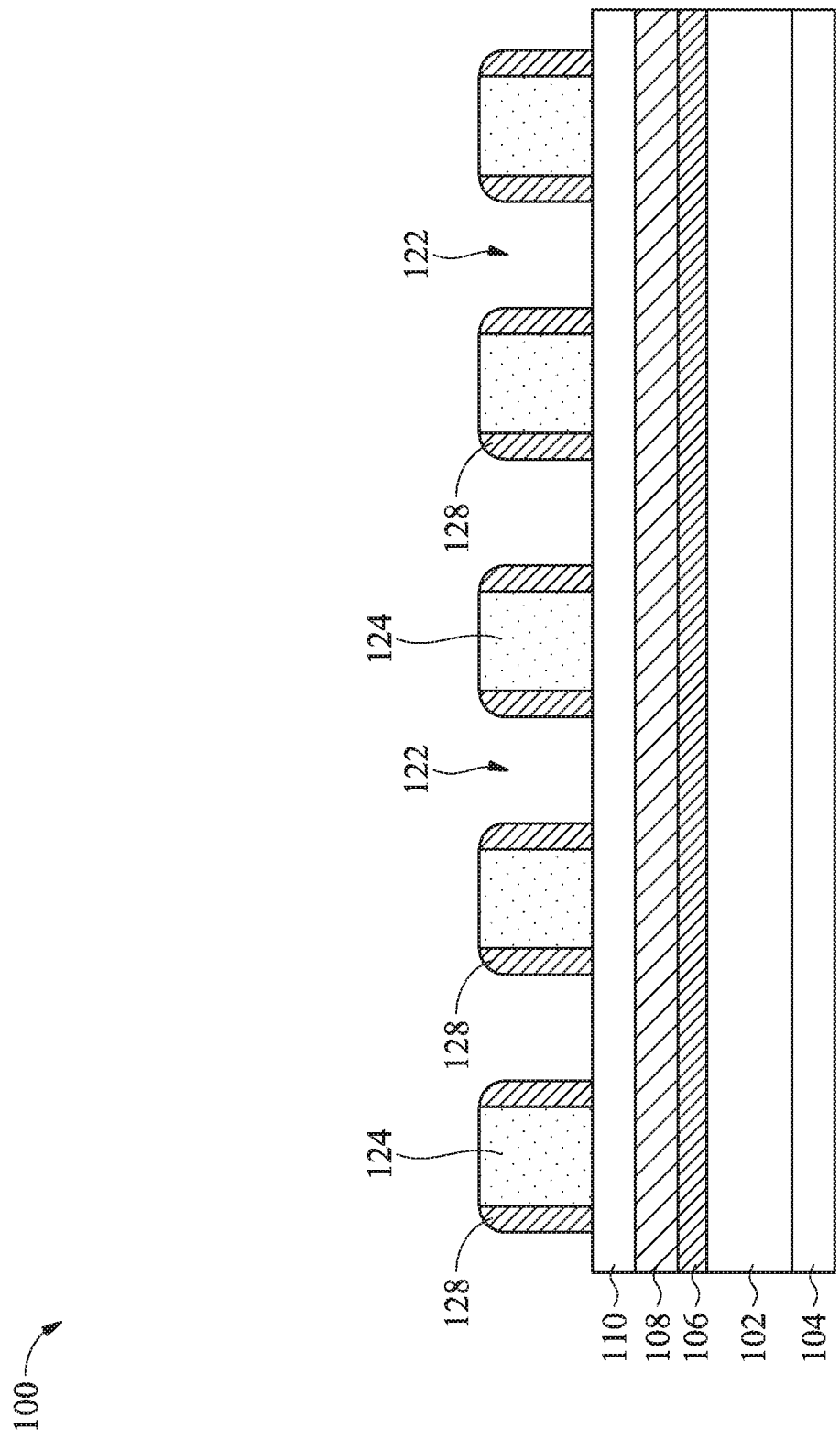

In FIG. 6, the spacer layer 126 is patterned to remove lateral portions of the spacer layer 126 while leaving spacers 128 on sidewalls of the mandrels 124. Etching the spacer layer 126 exposes the mandrels 124 and portions of the layer underlying the mandrels 124 (e.g., the dielectric layer 110 or the hard mask layer 108). Patterning the spacer layer 126 may include a dry etch process, which selectively etches the spacer layer 126 at a higher rate than the mandrels 124. Example etchants for etching the spacer layer 126 may include a fluorine reactive gas, such as, a carbon-fluro-based etchant ($C_xF_y$), $NF_3$, $SF_6$, $Cl_2$, or the like. Other process gases may be used in combination with the carbon-fluro-based etchants, such as, oxygen ($O_2$), nitrogen ($N_2$), argon (Ar), combinations thereof, or the like. In an embodiment, the process gases used to pattern the spacer layer 126 may be free of hydrogen. The dry etch process may anisotropic and etch exposed, lateral portions of the spacer layer 126 while leaving vertical portions of the spacer layer 126 (spacers 128) on the mandrels 124.

Because the mandrels 124 comprise SnO and are resistant to further oxidation throughout processing, the spacer layer 126 may be selectively etched without significantly etching the mandrels 124. For example, in embodiments where an outer area of the mandrels 124 is oxidized, the oxidized region may comprise a similar material as the spacer layer 126. Thus, portions of the mandrels 124 (particularly in the oxidized regions) may be inadvertently removed while patterning the spacer layer 126, resulting in manufacturing defects. By using SnO mandrels, such defects may be reduced or avoided.

Figure 7:
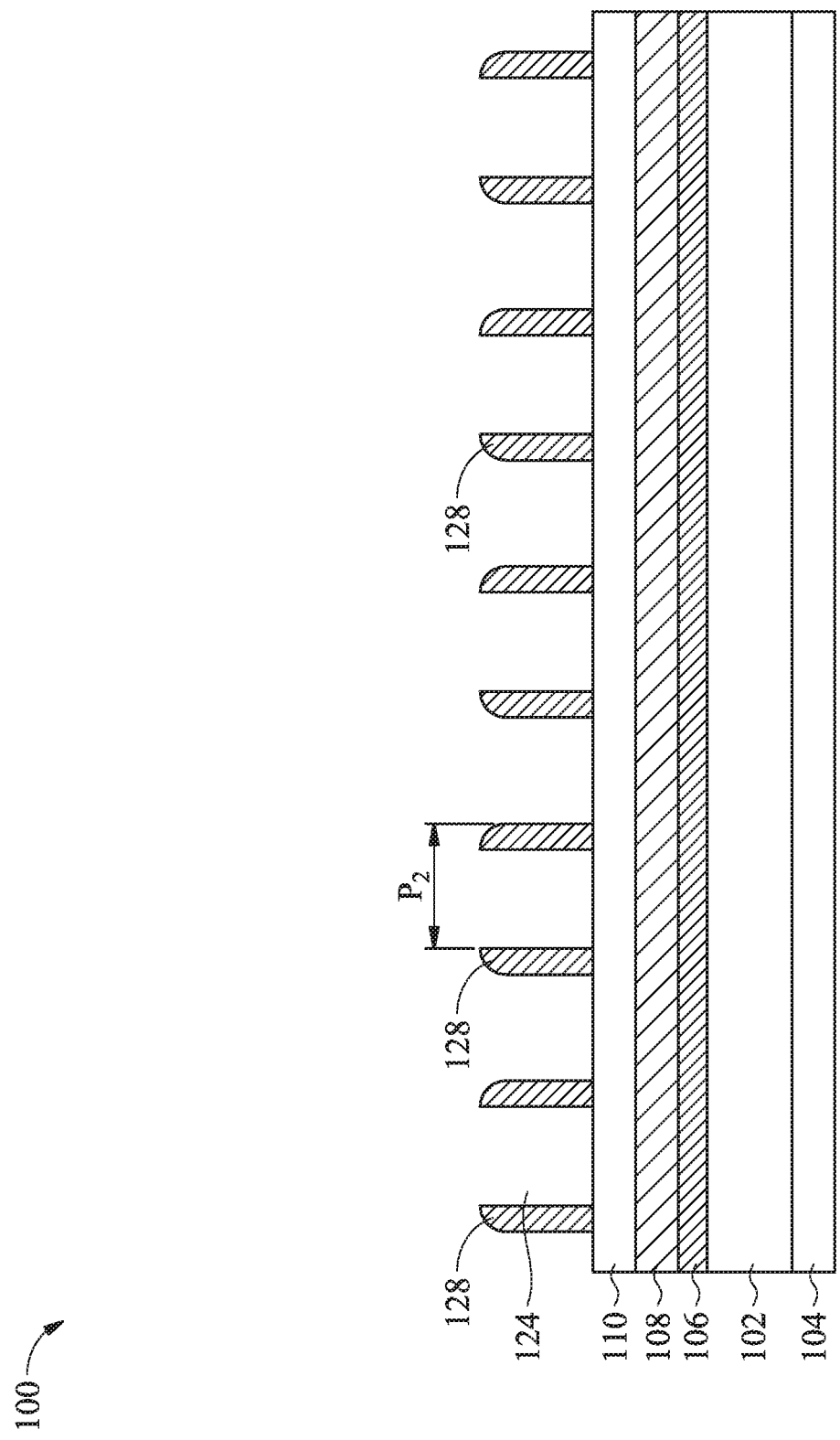

In FIG. 7, the mandrels 124 are removed using an etching process. Because the mandrels 124 and the spacers 128 have etch selectivity relative a same etch process, the mandrels 124 may be removed without removing the spacers 128. Etching the mandrels 124 exposes the underlying dielectric layer 110 (or hard mask layer 108), which may act as an etch stop layer. In some embodiments, etching the mandrels 124 may reduce a height of the spacers 128 without removing the spacers 128. Removing the mandrels 124 may comprise a dry etch process similar to the process used to pattern the mandrels 124 as described above in FIG. 4. For example, the dry etch process may use a hydrogen-containing reactive gas to selectively remove the mandrels 124 while leaving the spacers 128. However, a chemical composition of the etchant used to remove the mandrels 124 may the same or different as a chemical composition of the etchant used to pattern the mandrels 124. For example, a combination of $H_2$, Ar, and $N_2$ without $Cl_2$ may be used to pattern the mandrels 124 (e.g., as depicted in FIG. 4) and to remove the mandrels 124 (e.g., as depicted in FIG. 7). As another example, a combination of $H_2$, Ar, $N_2$, and $Cl_2$ may be used to pattern the mandrels 124 (e.g., as depicted in FIG. 4), and a combination of $H_2$, Ar, and $N_2$ without $Cl_2$ may be used to remove the mandrels 124 (e.g., as depicted in FIG. 7).

Because the mandrels 124 comprise SnO and are resistant to further oxidation throughout processing, the mandrels 124 may be removed with less residue using the selective removal process described above. For example, in embodiments where an outer area of the mandrels 124 is oxidized, the oxidized region may comprise a similar material as the spacers 128. Thus, selective removal of the mandrels 124 (particularly in the oxidized regions) may be difficult and result in residual mandrel material remaining on the spacers 128. This residual material changes critical dimensions of patterned features, resulting in manufacturing defects. By using SnO mandrels, such defects may be reduced or avoided.

Although FIG. 7 illustrates all of the mandrels 124 being removed, various embodiments also contemplate the selective removal of the mandrels 124. For example, in certain area (e.g., depending on device layout) of a wafer on which the target layer 102 is formed, mandrels 124 may be not be formed and/or removed. In order to achieve the selective removal of the mandrels 124, a photoresist may be deposited over the mandrels 124 and the spacers 128. The photoresist may be similar to photoresist 120, see FIGS. 1-3, and openings in the photoresist may expose areas where the mandrels 124 are removed while masking other areas of the mandrels 124 from removal. Subsequently, the photoresist may be removed using an ashing step.

After some or all of the mandrels 124 are removed, the spacers 128 may have a pitch P2. In embodiments where a SADP process as described above is employed, pitch P2 is one half of a minimum pitch achievable by photolithographic processes. The spacers 128 define a pattern for the hard mask layer 108. In some embodiments, the pattern defined by the spacers 128 is a negative of subsequently formed conductive lines. For example, the space around the pattern defined by the spacers 128 (openings 122) corresponds to a pattern of subsequently formed conductive lines. In other embodiments, the spacers 128 correspond to a pattern of semiconductor fins or gate structures.

FIGS. 8 through 10 illustrate cross sectional views of patterning and depositing features in the target layer 102 based on the pattern defined by the spacers 128. Referring first to FIG. 8, the dielectric layer 110 (see FIG. 7) and the hard mask layer 108 are sequentially etched using the spacers 128 as an etching mask. Any unremoved mandrels 124 may also be used as an etching mask to pattern the hard mask layer 108. Thus, the hard mask layer 108 may have a same pattern and pitch as the spacers 128. In some embodiments, etching the hard mask layer 108 comprises an anisotropic dry etch and/or wet etch. After the hard mask layer 108 is patterned, a wet cleaning may be performed to remove any remaining portions of the spacers 128 and the dielectric layer 110.

Subsequently, in FIG. 9, the hard mask layer 108 is used as an etching mask to pattern openings 140 in the target layer 102. Etching the target layer 102 may comprise an anisotropic dry etch process and/or a wet etch process, which sequentially etches through the ARC 106 to the target layer 102. Remaining portions of the target layer 102 may have a same pattern as the spacers 128 of FIG. 7. After the openings 140 are patterned, a wet cleaning may be performed to remove any remaining portions of the hard mask layer 108 and the ARC 106.

After openings 140 are patterned in the target layer 102, features may be formed in the openings 140. In an embodiment, the target layer 102 is a low-k dielectric, and the patterned target layer 102 provides an IMD for an interconnect structure. Conductive features such as copper lines, copper vias, and/or cobalt plugs may be formed in the IMD layer as illustrated by FIG. 10. Forming the conductive features may include depositing one or more liners 142 along sidewalls and a bottom surface of the openings 140 (see FIG. 9). The liners 142 may comprise TiO, TiN, TaO, TaN, or the like and may provide diffusion barrier, adhesion, and/or seed layers for the conductive feature. The liners may be deposited using any suitable process, such as, PVD, CVD, ALD, and the like.

After the liners 142 are deposited, remaining portions of the opening may be filled with a conductive material 144, such as copper using, e.g., PVD, plating, or the like. The conductive material 144 may be initially deposited to overfill the openings 140 (see FIG. 9), and a planarization process is performed to remove excess portions of the conductive material 144 over the target layer 102. Thus, conductive features may be formed in the target layer 102.

In other embodiments, the deposition process in FIG. 10 may be excluded. For example, in some embodiments, the hard mask layer 108 may be used to pattern the target layer 102, which is a semiconductor substrate. In such embodiments, the hard mask layer 108 defines a pattern of fins for finFET transistors. In other embodiments, the hard mask layer 108 may be used to pattern a blanket deposited layer (e.g., a conductive dummy gate layer). In such embodiments, the hard mask layer 108 defines a pattern of gate structures for transistors. Other features may also be patterned using the processes described above.

Various embodiments described above provide a patterning process. In particular, a self-aligned double patterning process is performed to pattern features (e.g., semiconductor fins, gate structures, conductive lines, or the like) in a semiconductor device. Tin oxide (SnO) is used as a material for mandrels during the double patterning process. It has been observed that by using SnO mandrels, the mandrels are resistant to oxidation while other processing is performed on the mandrels. By preventing undesirable oxidation of the mandrel material, manufacturing defects can be reduced.

Subsequently, spacers are formed on sidewalls of the mandrels, and the mandrels are selectively removed. The spacers are formed at one half of a pitch of the mandrels, and thus, features patterned using the spacers as a mask have a finer pitch than the mandrels. SnO mandrels have a further advantage of high etch selectivity to other materials (e.g., the spacer material, materials of the underlying layers, and the like), for example, using a hydrogen-containing gas etchant where hydrogen is used as the reactant to etching SnO. Thus, patterning reliability when patterning or removing the mandrels can be improved, and fine pitched semiconductor structures can be manufactured with improved yield.

In accordance with an embodiment, a method includes patterning a tin oxide layer to define a plurality of mandrels over a target layer; depositing a spacer layer over and along sidewalls of the plurality of mandrels; patterning the spacer layer to provide a plurality of spacers on the sidewalls of the plurality of mandrels; after patterning the spacer layer, removing the plurality of mandrels; and after removing the plurality of mandrels, patterning the target layer using the plurality of spacers. In an embodiment, patterning the tin oxide layer comprises a dry etching process using a gaseous etchant, wherein hydrogen as a reactive component of the gaseous etchant. In an embodiment, the gaseous etchant comprises $H_2$, HBr, $NH_3$, or combinations thereof. In an embodiment, dry etching process further comprises using a process gas comprising argon, nitrogen, or a combination thereof. In an embodiment, patterning the tin oxide layer comprises a dry etching process using a gaseous etchant, wherein chlorine as a reactive component of the gaseous etchant. In an embodiment, removing the plurality of mandrels comprises reducing a height of the plurality of spacers without removing the plurality of spacers. In an embodiment, the spacer layer comprises AlO, AlN, AlON, TaN, TiN, TiO, Si, SiO, SiN, or a combination thereof. In an embodiment, exposing the plurality of mandrels to oxygen plasma.

In accordance with an embodiment, a method includes etching a material layer to define a plurality of mandrels over a hard mask layer, wherein etching the material layer comprises using a first etching gas comprising hydrogen as a reactive component of the first etching gas; forming spacers on sidewalls of the plurality of mandrels; removing the plurality of mandrels to define openings between the spacers; using the spacers as mask to pattern the hard mask layer; and using the hard mask layer as a mask to pattern a target layer. In an embodiment, the material layer comprises tin oxide. In an embodiment, the first etching gas comprises $H_2$, HBr, $NH_3$, or combinations thereof. In an embodiment, removing the plurality of mandrels comprises using a second etching gas comprising hydrogen as a reactive component of the second etching gas. In an embodiment, removing the plurality of mandrels comprises using a second etching gas comprising chlorine as a reactive component of the second etching gas. In an embodiment, forming the spacers comprises depositing a spacer layer over and along sidewalls of the plurality of mandrels; and etching the spacer layer using an third etching gas that etches the spacer layer at a faster rate than the plurality of mandrels. In an embodiment, the third etching gas comprises fluorine as a reactive component of the third etching gas.

In accordance with an embodiment, a method includes etching a plurality of openings in a tin oxide layer using a photoresist as a photomask; after etching the plurality of openings, removing at least a portion of the photoresist using oxygen plasma, wherein removing the portion of the photoresist exposes the tin oxide layer to the oxygen plasma; depositing a spacer layer along sidewalls and bottom surfaces of the plurality of openings; removing lateral portions of the spacer layer while leaving portions of the spacer layer on the sidewalls of the plurality of openings; after removing the lateral portions of the spacer layer, selectively removing the tin oxide layer using a first hydrogen-containing reactive gas; and after removing the tin oxide layer, using remaining portions of the spacer layer as a mask to etch a hard mask layer. In an embodiment, etching the plurality of openings further comprises using a second hydrogen-containing reactive gas. In an embodiment, the first hydrogen-containing reactive gas is $H_2$, HBr, $NH_3$, or combinations thereof. In an embodiment, etching the plurality of openings further comprises using a process gas comprising argon, nitrogen, or a combination thereof. In an embodiment, removing the lateral portions of the spacer layer comprises using an etching chemical that etches the spacer layer at a faster rate than the tin oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a first plurality of openings in a tin oxide layer using a photoresist as a photomask, wherein etching the first plurality of openings in the tin oxide layer comprises a plasma etch that supplies a hydrogen plasma and a chlorine plasma in combination as etchants to etch the tin oxide layer;
    after etching the first plurality of openings, removing at least a portion of the photoresist using oxygen plasma, wherein removing the portion of the photoresist exposes the tin oxide layer to the oxygen plasma;
    depositing a spacer layer along sidewalls and bottom surfaces of the first plurality of openings;
    removing lateral portions of the spacer layer while leaving portions of the spacer layer on the sidewalls of the first plurality of openings;
    after removing the lateral portions of the spacer layer, selectively removing the tin oxide layer using a first hydrogen-containing reactive gas; and
    after removing the tin oxide layer, using remaining portions of the spacer layer as a mask to etch a hard mask layer.

2. The method of claim 1, wherein the first hydrogen-containing reactive gas is H2, HBr, NH3, or combinations thereof.

3. The method of claim 1, wherein etching the first plurality of openings further comprises using a process gas comprising argon, nitrogen, or a combination thereof.

4. The method of claim 1, wherein removing the lateral portions of the spacer layer comprises using an etching chemical that etches the spacer layer at a faster rate than the tin oxide layer.

5. The method of claim 1, wherein etching chemistries used for selectively removing the tin oxide layer is different than etching chemistries used for etching the first plurality of openings in the tin oxide layer.

6. The method of claim 5, wherein selective removing the tin oxide layer comprises selectively removing the tin oxide layer without using chlorine as an etchant.

7. The method of claim 1 further comprising:
    patterning a plurality of second openings in the photoresist; and
    after patterning the plurality of second openings and before etching the first plurality of openings in the tin oxide layer, widening each of the plurality of second openings in the photoresist.

8. The method of claim 1, wherein the photoresist comprises:
    a photosensitive top layer;
    a middle layer comprising an inorganic material under the photosensitive top layer; and
    a bottom anti-reflective coating layer (BARC) under the middle layer.

9. The method of claim 8, wherein removing at least the portion of the photoresist using oxygen plasma comprises removing at least a portion of the bottom anti-reflective coating layer using the oxygen plasma.

10. A method comprising:
    etching a first plurality of openings in a tin oxide layer using a photoresist as a photomask, wherein etching the first plurality of openings in the tin oxide layer comprises a plasma etch that supplies a hydrogen plasma and a chlorine plasma in combination as etchants to etch the tin oxide layer;
    after etching the first plurality of openings, removing at least a portion of the photoresist using oxygen plasma, wherein removing the portion of the photoresist exposes the tin oxide layer to the oxygen plasma;
    depositing a spacer layer along sidewalls and bottom surfaces of the first plurality of openings;
    removing lateral portions of the spacer layer while leaving portions of the spacer layer on the sidewalls of the first plurality of openings;
    after removing the lateral portions of the spacer layer, selectively removing the tin oxide layer using a first hydrogen-containing reactive gas;
    after removing the tin oxide layer, using remaining portions of the spacer layer as a mask to etch a hard mask layer; and
    transferring a pattern of the hard mask layer to a target layer, the target layer underlies the hard mask layer.

11. The method of claim 10, wherein the target layer is a low-k dielectric layer, and transferring the pattern of the hard mask layer to the target layer comprises patterning a second plurality of openings through the low-k dielectric layer.

12. The method of claim 11 further comprising:
depositing a diffusion barrier layer in the second plurality of openings; and
depositing a conductive material over the diffusion barrier layer and in the second plurality of openings.

13. The method of claim 10, wherein the plasma etch further comprises using a process gas comprising argon, nitrogen, or combinations thereof.

14. The method of claim 10, wherein the plasma etch comprises generating the hydrogen plasma from a gaseous etchant comprising HBr, H2, NH3, or combinations thereof.

15. The method of claim 10, wherein the spacer layer comprises AlO, AlN, AlON, TaN, TiN, TiO, Si, SiO, SiN, or a combination thereof.

16. The method of claim 10 further comprising depositing the tin oxide layer on an anti-reflective coating layer, wherein patterning the first plurality of openings in the tin oxide layer further comprises using the anti-reflective coating layer as an etch stop layer.

17. A method comprising:
depositing a tin oxide layer on a first anti-reflective coating (ARC) layer;
etching a first plurality of openings in a tin oxide layer using a photoresist as a photomask, wherein etching the first plurality of openings in the tin oxide layer comprises a plasma etch that supplies a hydrogen plasma and a chlorine plasma in combination as etchants to etch the tin oxide layer, and wherein etching the first plurality of openings in the tin oxide layer further comprises using the first ARC layer as an etch stop layer;
after etching the first plurality of openings, removing at least a portion of the photoresist using oxygen plasma, wherein removing the portion of the photoresist exposes the tin oxide layer to the oxygen plasma;
depositing a spacer layer along sidewalls and bottom surfaces of the first plurality of openings;
removing lateral portions of the spacer layer while leaving portions of the spacer layer on the sidewalls of the first plurality of openings;
after removing the lateral portions of the spacer layer, selectively removing the tin oxide layer using a first hydrogen-containing reactive gas; and
after removing the tin oxide layer, using remaining portions of the spacer layer as a mask to etch a hard mask layer; and
transferring a pattern of the hard mask layer to a target layer, the target layer underlies the hard mask layer.

18. The method of claim 17, wherein the spacer layer comprises AlO, AlN, AlON, TaN, TiN, TiO, Si, SiO, SiN, or a combination thereof.

19. The method of claim 17, wherein the first ARC is between the hard mask layer and the tin oxide layer.

20. The method of claim 17, further comprising:
depositing the target layer over a substrate;
depositing a second ARC layer over the target layer; and
depositing the hard mask layer over the second ARC layer.

* * * * *